US008187518B2

(12) United States Patent
Lee et al.

(10) Patent No.: US 8,187,518 B2
(45) Date of Patent: May 29, 2012

(54) METHOD FOR MANUFACTURING SUBSTRATE BY IMPRINTING

(75) Inventors: Choon-Keun Lee, Suwon-si (KR);
Myeong-Ho Hong, Suwon-si (KR);
Seung-Heon Han, Seoul (KR);
Senug-Hyun Ra, Seongnam-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 777 days.

(21) Appl. No.: 11/713,608

(22) Filed: Mar. 5, 2007

(65) Prior Publication Data
US 2007/0207297 A1   Sep. 6, 2007

(30) Foreign Application Priority Data

Mar. 6, 2006 (KR) .................. 10-2006-0020853

(51) Int. Cl.
*B29C 43/00* (2006.01)
*B32B 37/00* (2006.01)
*B29C 59/00* (2006.01)

(52) U.S. Cl. ........ 264/319; 264/104; 264/134; 264/139; 264/162; 264/284; 264/293; 264/320; 264/338; 156/307.7; 425/385; 977/887

(58) Field of Classification Search ................... 977/887; 264/319; 156/307.3, 307.7
See application file for complete search history.

(56) References Cited

U.S. PATENT DOCUMENTS

| | | | | |
|---|---|---|---|---|
| 4,407,883 | A * | 10/1983 | Newton ................ | 428/215 |
| 4,614,837 | A * | 9/1986 | Kane et al. ............ | 174/257 |
| 5,761,801 | A * | 6/1998 | Gebhardt et al. ...... | 29/846 |
| 2003/0068887 | A1* | 4/2003 | Shingubara et al. .... | 438/687 |

FOREIGN PATENT DOCUMENTS

| | | |
|---|---|---|
| CN | 1193452 A | 9/1998 |
| CN | 1397989 A | 2/2003 |
| JP | 4-318177 | 11/1992 |
| JP | 2000-114719 | 4/2000 |
| JP | 2007-158017 | 6/2007 |
| WO | 2006/129734 A1 | 12/2006 |
| WO | WO 2006/129734 A1 | 12/2006 |

OTHER PUBLICATIONS

Chen, H.L., S.Y. Chuang, H.C. Cheng, C.H. Lin, T.C. Chu, Directly patterning metal films by nanoimprint lithography with low-temeprature and low-pressure, Microelectronic Engineering, vol. 83 (2006), pp. 893-896.*
Chinese Office Action issued on Feb. 6, 2009 in corresponding Chinese Patent Application 2007100867045. Japanese Office Action issued on Jun. 1, 2009 in corresponding Japanese Patent Application 2007-048563.
Japanese Office Action dated Mar. 2, 2010 and issued in corresponding Japanese Patent Application 2007-048563.
Chinese Office Action issued Mar. 29, 2011 in corresponding Chinese Patent Application 200710086704.5.
Japanese Office Action issued Apr. 19, 2011 in corresponding Japanese Patent application 2010-23971.
Japanese Office Action dated Jan. 17, 2012 issued in corresponding Japanese Patent Application No. 2007-48563.

* cited by examiner

*Primary Examiner* — Jeffrey Wollschlager

(57) ABSTRACT

While releasing property between a resin layer and an imprinting mold is given by using a metal thin film layer, a method for manufacturing a substrate advantageous for forming a conductive layer by plating and a substrate manufactured by the method are provided. According to one aspect of the present invention, a method for manufacturing a substrate by imprinting, the method comprising: laminating a metal thin film layer on top of a resin layer; pressurizing the resin layer and the metal thin film layer by an imprinting mold which comprises a side having a pattern in correspondence with a wiring pattern; curing a resin which forms the resin layer; and removing the imprinting mold from the resin layer and the metal thin film layer, may be presented.

5 Claims, 2 Drawing Sheets

METHOD FOR MANUFACTURING SUBSTRATE BY IMPRINTING

CROSS-REFERENCE TO RELATED APPLICATIONS

This application claims the benefit of Korean Patent Application No. 10-2006-0020853 filed on Mar. 6, 2006 with the Korean Intellectual Property Office, the contents of which are incorporated here by reference in their entirety.

BACKGROUND

1. Technical Field

The present invention relates to a method for manufacturing a substrate and more especially, to a method for manufacturing a substrate by an imprinting method.

2. Description of the Related Art

According to the trend of the thin film, the light weight, and the multifunction of an electronic product, minute patterning, miniaturization, densification and packaging of a substrate used for the electronic product are also required at the same time. Therefore, a plurality of researches is being performed to embody a circuit having an excellent signal handling capability in a small area.

In order to form an exceedingly fine wiring, the method for forming a wiring pattern by imprinting, in which a pattern on a board is compressed by a stamp in correspondence with the wiring pattern and is transferred, is being tried out. In order to enhance a mass producibility in the manufacture of a substrate by this kind of imprinting, a facing imprinting should be possible. For the facing imprinting, the problem of a releasement between a substrate and an imprinting mold should certainly be solved. That is, in case of thermocompressing the resin layer on a substrate by using the metallic imprinting mold in the conventional imprinting process, a resin was arrested in the pattern channel on the mold so that there were some difficulties in transferring the perfect pattern. A plurality of efforts to solve the above problems of this releasing amount is being attempted. For examples, the method for spreading the releasing agent on the imprinting mold, for coating with a material having a low surface energy, for manufacturing an imprinting mold itself with a material having a low surface energy, for coating an releasing agent on the imprinted resin layer or for mixing a resin layer itself with a releasing agent or a released material are being presented. But there is a limit to giving not only durability but also perfect releasing property by the conventional method.

SUMMARY

The present invention provides a method for manufacturing a substrate which is advantageous for not only forming a conductive layer by plating but also exhibiting a releasing property between a resin layer and an imprinting mold by using a metal thin film layer, and a substrate manufactured thereby.

According to one aspect of the present invention, a method for manufacturing a substrate by imprinting, the method including: laminating a metal thin film layer on top of a resin layer; pressurizing the resin layer and the metal thin film layer by an imprinting mold which includes a side having a pattern in correspondence with a wiring pattern; curing a resin which forms the resin layer; and removing the imprinting mold from the resin layer and the metal thin film layer, may be presented.

Here, the resin layer may include a thermosetting resin, and according to an embodiment of the present invention, the thermosetting resin may be an epoxy resin.

Here, the metal thin film layer may include at least one selected from the group consisting of Au, Ag, Ni, Al, Cu and an alloy thereof, and a thickness of the metal thin film layer may be 0.1 to 100 μm.

Also here, the laminating is performed at a temperature in which the thermosetting resin may possess thermal flowability and may bond to the metal thin film layer. According to an embodiment of the present invention the laminating may be performed at the temperature range of 60 to 120° C. Also here, the curing may be performed in the temperature range of 80 to 250°C.

Also here, the method for manufacturing a substrate by imprinting may further include forming a conductive layer on the negative part of the wiring pattern transferred to the metal thin film layer; and removing the conductive layer and the metal thin film layer to correspond with a height of the resin layer. Here, the conductive layer of the forming the conductive layer is formed by electrolysis plating.

According to another aspect of the present invention, a substrate manufactured by the method for manufacturing a substrate by the mentioned imprinting may be provided. Here, the substrate may comprise a conductive wiring having a thickness of 50 nm to 15 μm.

DETAILED DESCRIPTION

Hereinafter, embodiments of the method for manufacturing a substrate by imprinting of the present invention will be explained in detail with reference to the accompanying drawings. The kind of the imprinting mode will first be explained before the embodiments are described in detail.

According to the characteristic of a material, the imprinting mode has a hot embossing mode using a thermoplastic or a thermosetting material and an UV mode using a photocurable material. In the hot embossing mode, the imprinting mold or the stamp (tool foil) formed to 3D pattern is thermocompressed to a board on which the thermoplastic or the thermosetting resin is laminated. Thereafter, 3D pattern on the mold is transferred to the thermoplastic or the thermosetting material by removing the imprinting mold or the stamp when the thermosetting resin is completely solidified or cured. Also, the UV mode is the method that 3D pattern on the mold is transferred to a photocurable material. Here, the transparent imprinting mold or the stamp (tool foil), on which 3D pattern is implemented, is compressed to the material on which the photocurable material is coated so that the photocurable material completely soaks into the imprinting mold or the stamp. After that, the photocurable material is irradiated by UV to cause the photocuring and is released.

Figure 1:
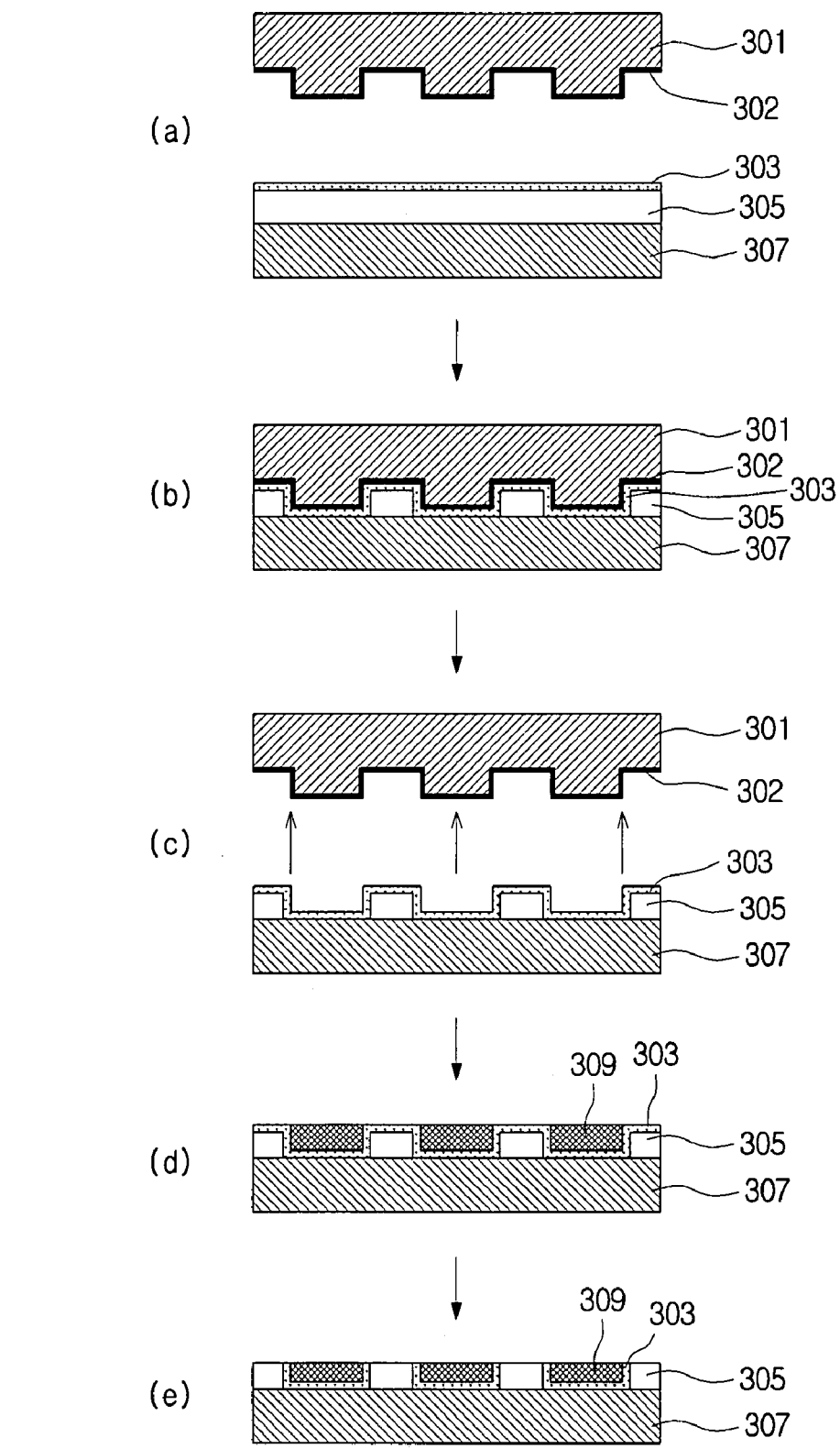
FIG. 1 is a flow diagram illustrating a method for manufacturing a substrate according to an embodiment of the present invention.

FIG. 1 is a flow diagram illustrating a method for manufacturing a substrate according to an embodiment of the present invention. Referring to FIG. 1 is illustrated an imprinting mold 301, a releasing layer 302, a metal thin film layer 303, a resin layer 305, a lower substrate 307 and a conductive layer 309.

A method for manufacturing a substrate of the present invention may include: laminating a metal thin film layer 303 on top of a resin layer 305; pressurizing the resin layer 305 and the metal thin film layer 303 by an imprinting mold 301 which includes a side having a pattern in correspondence with a wiring pattern; curing a resin which forms the resin layer 305; and removing the imprinting mold 301 from the resin layer 305 and the metal thin film layer 303, forming a conductive layer 309 on a negative part of the wiring pattern transferred to the metal thin film layer 303; and removing the conductive layer 309 and the metal thin film layer 303 in correspondence with the height of the resin layer 305. Each operation will be explained in sequence. Here, a negative part refers to a part going down based on the resin layer height or to a part in which a metal is charged in the additive or the semi-additive mode.

The laminating is an operation of laminating a metal thin film layer on top of a resin layer. Here, the thermosetting resin is desirable to form the resin layer. And the kind of the thermosetting resin forming a substrate may be used without a limit. According to an embodiment of the present invention, an epoxy resin or a reformed epoxy resin may be used. The epoxy resin made from one kind is rare and plural kinds of epoxy resins are mixed to be used according to a required thermal and electrical characteristic. Also, the epoxy resin may include various additives for the fire retardant characteristic or the dimensional stability, etc. and it may be reformed to be used.

The metal which may be included in the plating layer made by the electroless plating or the electrolysis plating may be used without a limit. Here, the metal may be a single metal or an alloy, and the metal thin film layer may be a multi-layered thin film formed by same or different metals. According to an embodiment of the present invention, the metal thin film layer may be made of at least one metal selected from the group of Au, Ag, Ni, Al, Cu and an alloy thereof and preferably may be made of Cu, Al or Ni. A thickness of the metal thin film layer may be 0.1 to 100 μm in order that the wiring pattern may be transferred by the imprinting mold and that may be suitable to laminate more of the conductive plating layer. If the thickness of the metal thin film layer is thicker than 100 μm, it is inconvenient to remove a surplus metal thin film layer laminated in the resin layer and it is not desirable in the efficiency.

An operation of laminating may be performed at a fixed temperature to bond the metal thin film layer and resin layer. There is no need to raise the temperature to the glass transition temperature of the resin composed in the resin layer, but it is preferable that the resin layer possess some thermal flowability that it may adhere closely when the metal thin film layer is laminated. This is because when the metal thin film layer is separated from the resin layer, they should not cross each other in one plane in order to transfer accurately a wiring pattern on a post-processing or imprinting. For example, it is preferable that the laminating a metal thin film layer be performed at 50 to 120° C. in case of the epoxy resin in order to form the condition of this resin layer.

The pressurizing is an operation of pressuring a resin layer 305 and a metal thin film layer 303 by an imprinting mold 301 which includes a side having a pattern in correspondence with a wiring pattern. The operation of pressurizing can be performed within a scope apparent to those skilled in the art and is not specially limited by the condition of the pressurization or the imprinting mold. The side of the imprinting mold corresponding to the wiring pattern may possess better releasing property with the resin layer by further including a releasing layer. According to an embodiment of the present invention, the releasing layer may be a layer including F, Si, or an alloy thereof. Here, the pattern corresponding to the wiring pattern refers to the pattern in which an intaglio and an embossment are reversed to the wiring pattern which is to be formed.

In the curing a resin forming the resin layer 305, it is heated to cure the resin to an appropriate temperature, corresponding to the used resin. For example, in case of the epoxy resin, a substrate may be treated at 80 to 250° C. to cure the resin layer. Such a curing of a substrate can be performed in a normal condition.

The removing the imprinting mold is an operation of removing the imprinting mold 301 from a resin layer 305 and a metal thin film layer 303, and the forming the conductive layer is an operation of forming a conductive layer 309 on the negative part of the wiring pattern transferred to the metal thin film layer 303. The forming the conductive layer is the operation of forming the conductive layer by the conventional additive or semi-additive mode. The operation of the electroless plating may be omitted in the operation of forming because the metal thin film layer has already been formed. Therefore the operation of forming has the advantage that the plating may be performed by a simple way. Here, the conductive layer 309 may be formed by using electrolysis plating. And the concrete method of electrolysis plating may be presented by the normal plating bath condition. Preferably, a copper plating layer is formed by using the copper plating bath. The plating condition is not limited to such conditions set forth above. For example, a copper conductive layer of the present invention may be formed by using of copper cyanide plating composition and processing condition which are presented in the following table. Here, if potassium cyanide including at least one metal selected from the group consisting of Au, Ag, Ni, Al and an alloy thereof instead of Cu may form a conductive layer which includes each metal.

| | strike(g/L) | medium concentration | high concentration |
|---|---|---|---|
| copper cyanide (CuCN) | 20 to 40 | 60 to 75 | 90 to 120 |
| sodium cyanide (NaCN) | 35 to 54 | 70 to 85 | 100 to 135 |
| free sodium cyanide | 15 or more | 5 to 10 | 5 to 10 |
| potassium cyanide (KCN) | — | 91 to 97 | 130 to 175 |
| sodium hydroxide (NaOH) | 0 to 7 | 10 to 40 | 25 |
| potassium hydroxide (KOH) | — | 10 to 40 | 25 |
| pH | 11.5 | 12.4 | 12.4 to 12.6 |
| temperature (° C.) | 45 to 60 | 60 to 70 | 75 to 85 |
| electric current density (A/dm$^2$) | — | 2 to 4 | 2 to 11 |

The removing the conductive layer and the metal thin film layer is an operation of removing the conductive layer 309 and the metal thin film layer 303 in correspondence with a height of the resin layer 305.

The removing operation is an operation of removing an unnecessary nickel layer and a surplus plating layer, which do not contribute to the plating in order to form a multi-layer substrate or to laminate an insulating layer. The removing these layers may be performed by a physical or a chemical etching. Also it is apparent that the normal etching method of a conductive layer may be used without a limit.

Figure 2:
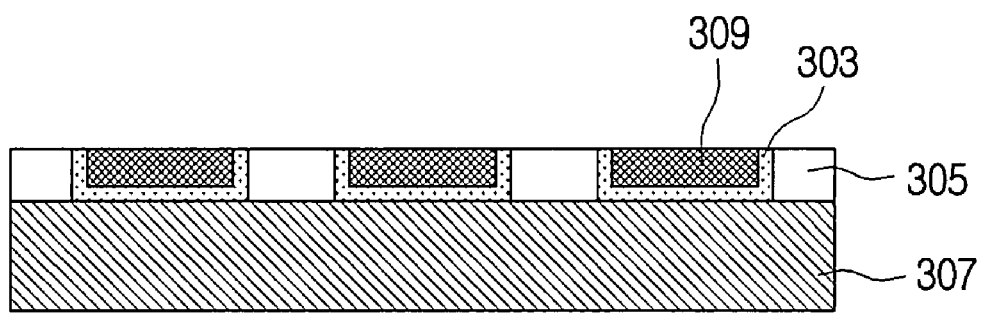
FIG. 2 is a cross-sectional view of a substrate according to an embodiment of the present invention.

FIG. 2 is a cross-sectional view of a substrate according to an embodiment of the present invention. Referring to FIG. 2, a substrate of the present invention is manufactured by the above-described method. The substrate includes a resin layer 305 on the top of a lower substrate 307, a metal thin film layer

303 corresponding to a wiring pattern, and a conductive layer 309 on the metal thin film layer. The above-described manufacturing method may form a wiring with much finer wiring width than the conventional subtractive, additive or semi-additive method. According to an embodiment of the present invention, a substrate of the present invention may have a wiring having the width of 50 nm to 15 μm.

In the above, the method for manufacturing a substrate by imprinting has been explained. Although not mentioned here, it is apparent that the method for manufacturing a substrate by imprinting may comprise a pre-processing or a post-processing which are applied in the normal range in which the person skilled in the art performs the imprinting process. As described in the above, the substrate in which a wiring pattern is formed by the imprinting may form a multi-layer substrate by laminating in the normal range.

The present invention is to provide the method and the substrate manufactured by the e method of the substrate which is advantageous for the conductive layer formation by the plating it gives a heterogeneity between the resin layer and the imprinting mold it uses the metal thin film layer.

What is claimed is:

1. A method for manufacturing a substrate by imprinting, the method comprising:
   laminating a metal thin film layer on top of a resin layer comprising a thermosetting resin, the laminating being performed at a temperature of a range of 60 to 120° C. at which the thermosetting resin possesses thermal flowability and bonds to the metal thin film layer;
   pressurizing the resin layer and the metal thin film layer by an imprinting mold which includes a side having a pattern in correspondence with a wiring pattern, the side having the pattern in correspondence with the wiring pattern including a releasing layer comprising at least one selected from the group consisting of F, Si, or an alloy thereof formed thereon;
   curing a resin which forms the resin layer;
   removing the imprinting mold from the resin layer and the metal thin film layer;
   forming a conductive layer by electrolysis plating on a negative part of the wiring pattern transferred to the metal thin film layer without use of electroless plating; and
   removing the conductive layer and the metal thin film layer to correspond with a height of the resin layer.

2. The method of claim 1, wherein the thermosetting resin is an epoxy resin.

3. The method of claim 1, wherein the metal thin film layer comprises at least one selected from the group consisting of Au, Ag, Ni, Al, Cu and an alloy thereof.

4. The method of claim 1, wherein a thickness of the metal thin film layer is 0.1 to 100 μm.

5. The method of claim 1, wherein the curing is performed at the temperature range of 80 to 250° C.

* * * * *

UNITED STATES PATENT AND TRADEMARK OFFICE
CERTIFICATE OF CORRECTION

PATENT NO. : 8,187,518 B2
APPLICATION NO. : 11/713608
DATED : May 29, 2012
INVENTOR(S) : Choon-Keun Lee et al.

It is certified that error appears in the above-identified patent and that said Letters Patent is hereby corrected as shown below:

Title page Column 2 (Other Publications), Line 3, Delete "temeprature" and insert -- temperature --, therefor.

Title page Column 2 (Other Publications), Lines 6-8, Delete "Japanese Office Action issued on Jun. 1, 2009 in corresponding Japanese Patent Application 2007-048563." and insert the same on Title page, Col. 2, under Other Publications, Line 7, below "2007100867045." as a new entry.

Signed and Sealed this
Twenty-eighth Day of August, 2012

David J. Kappos
*Director of the United States Patent and Trademark Office*